United States Patent [19]
Beaumont

[11] Patent Number: 5,920,114
[45] Date of Patent: Jul. 6, 1999

[54] LEADFRAME HAVING RESILIENT CARRIER POSITIONING MEANS

[75] Inventor: Guy D. Beaumont, Granby, Canada

[73] Assignee: International Business Machines Corporation, Armonk, N.Y.

[21] Appl. No.: 08/936,759

[22] Filed: Sep. 25, 1997

[51] Int. Cl.$^6$ .................................................. H01R 43/00
[52] U.S. Cl. ................ 257/666; 257/676; 257/797; 257/672; 257/669
[58] Field of Search ..................................... 257/666, 676, 257/672, 797, 668, 670, 673, 674, 690, 692, 698

[56] References Cited

U.S. PATENT DOCUMENTS 4,089,575  5/1978  Grabbe ................................ 339/17 CF
4,763,409  8/1988  Takekawa et al. ...................... 257/672

Primary Examiner—Alexander Oscar Williams
Attorney, Agent, or Firm—Ira D. Blecker

[57] ABSTRACT

The present invention relates to an improved leadframe and method of attaching leads of a leadframe to contact pads on a carrier. The leadframe includes resilient engaging means or fingers for engaging the carrier and for exerting forces on the carrier to thereby support the carrier and accurately position and align the contact pads on the carrier with the leads. This invention overcomes the expense and inaccuracies of known leadframe designs and techniques in attaching leads to carrier contact pads using such things as fixtures for positioning the leadframe and carrier, visual alignment procedures and retaining tabs.

15 Claims, 3 Drawing Sheets

LEADFRAME HAVING RESILIENT CARRIER POSITIONING MEANS

FIELD OF THE INVENTION

This invention generally relates to integrated circuit chip packaging and in particular relates to the attachment of leadframes to carrier substrates for integrated circuit or semiconductor circuit chip devices. The invention relates to providing a leadframe and method for supporting a carrier and accurately positioning and holding the carrier and aligning the carrier contact pads with the leads of the leadframe so that the leads can be properly and accurately bonded to the contact pads.

BACKGROUND OF THE INVENTION

Packaging of integrated circuit devices is becoming increasingly more difficult and complex in view of the increased number of input/output connections being required for the carrier-mounted chip devices. Multiple hundreds of connections are not uncommon with the accompanying number of leads. One way external connections are provided is to mount a chip on a substrate carrier whereby the contact pads on the chip are aligned with contacts appropriately arranged and typically in a matrix pattern on one side of the carrier. These contacts on the one side of the carrier communicate via conductive traces within the carrier to contacts on the other side of the carrier to which are connected the leads of the leadframe. Alternatively, as permitted by some device designs, the contact pads to be connected to the leadframe could be located on the same side of the carrier to which the chip is mounted. Thus, in the resultant packaged chip device, external leads are electrically connected as required to the chip.

A present process used for attaching a leadframe to a carrier includes the combination of the use of a brazing fixture and visual alignment of the leads of the leadframe and the pads on the carrier. The fixture consists of two parts and both are usually made of a graphite material but could also be made of other materials including ceramic materials. The first part holds a ceramic substrate or carrier and the second part is placed over the first part and holds the leadframe. This arrangement, however, is only able to grossly or coarsely position the leads of the leadframe with respect to the pads on the carrier. This is so because of the differences in coefficients of thermal expansion, amongst the fixtures, the carrier and the leadframe. It has been experienced that there has to be a considerable amount of spatial play built into the various elements amongst the respective fixtures, the carrier and the leadframe in order to accommodate for these thermal mismatches. No way is presently known that fixtures can be built to result in precise alignment of the leads on the leadframe and the pads on the carrier because a considerable amount of play amongst the elements is required when connections are accomplished using silver brazing which requires temperatures of 800° C. to 1000° C. or even at lower temperatures for solder brazing. To accomplish the solder reflow of the pads, the combination of the assembled elements is placed in a furnace. Thus, significant play is required to accommodate the need for the differences in thermal expansion. With the presently known apparatus and process involved, only gross positioning of the various elements is possible and fine positioning results from a visual alignment of the leads and the pads by a human operator. The leads are then bonded to the pads.

DESCRIPTION OF THE PRIOR ART

There are a variety of arrangements known and described in the prior art for attaching leads to an integrated circuit chip device. These include the following patent documents with the accompanying summaries:

U.S. Pat. No. 4,536,825, entitled "Leadframe Having Severable Fingers for Aligning One or More Electronic Circuit Device Components", which issued Aug. 20, 1985, to Unitrode Corp., describes fixed alignment fingers and positioning tabs on a leadframe for aligning a circuit device with respect to a leadframe.

U.S. Pat. No. 5,275,897, entitled "Precisely Aligned Leadframe Using Registration Traces and Pads", which issued Jan. 4, 1994, to Hewlett Packard Company, relates to tape automated bonding of leadframes to a substrate and instead of aligning the pattern of signal leads of the frame to the signal leads on the substrate, the focus is on aligning the registration pads on a substrate and the alignment traces on the tape.

U.S. Pat. No. 4,466,183, entitled "Integrated Circuit Packaging Process", which issued Aug. 21, 1984, to National Semiconductor Corp., is directed to an automatic tape assembly process where an integrated circuit device is assembled to leads on a tape which also provides dummy leads for holding the integrated circuit device prior to testing and encapsulation.

U.S. Pat. No. 5,214,846, entitled "Packaging of Semiconductor Chips", which issued Jun. 1, 1993, to Sony Corp., relates to packaging of semiconductor chips directly on to leadframes with fingers on the leadframe for restricting movement of the chip with respect to the leadframe.

U.S. Pat. No. 4,651,415, entitled "Leaded Chip Carrier", which issued Ma. 24, 1987, to Diacon, Inc., relates to a leaded chip carrier and deals with mismatch of thermal coefficient of expansion in the packaging process by use of four separate subframe quadrants and the use of tabs to align between an assembly locating plate and a base plate.

U.S. Pat. No. 5,299,097, entitled "Electronic Part Mounting Board and Semiconductor Device Using the Same", which issued Mar. 29, 1994, to Ibiden Co. Ltd., pertains to an electronic part mounting board and a semiconductor device which teaches use of four board fixing pins at each corner of leadframe through which press fit pins are inserted to ensure accurate positioning of the leadframe during processing.

U.S. Pat. No. 5,278,447, entitled "Semiconductor Device Assembly Carrier", which issued Jan. 11, 1994, to LSI Logic Corp., pertains to semiconductor device assembly carrier for supporting and protecting the device and its leads from damage during handling.

U.S. Pat. No. 5,307,929, entitled "Lead Arrangement for Integrated Circuits and Method of Assembly", which issued May 3, 1994, to North American Specialities Corp., relates to lead arrangements for integrated circuits and describes fold over leadframe retaining tabs for holding and retaining the substrates against the leads during soldering.

BRIEF SUMMARY OF THE INVENTION

It is therefore an object of the invention to provide a new self align leadframe and associated method for attaching leads to a carrier which provide for significant improvements and results over that obtained from the use of the known prior art leadframes and methods previously described.

It is a further object of this invention to provide a new self align leadframe and method for supporting a carrier and attaching leads to contact pads of the carrier without the difficulty in accuracies and expense of using fixtures as is presently done.

According to one aspect of the invention, there is provided an improved leadframe for supporting a carrier for an integrated circuit device and maintaining alignment of contact pads on the carrier with leads of the leadframe, which includes a leadframe circumscribing an area and having a plurality of leads on each side of said frame and extending into the circumscribed area, said carrier having contact pads on one side thereof, said carrier being of the same general shape and size as said area circumscribed by said leadframe such that each of said plurality of leads overlays one of said contact pads. The leadframe further comprises resilient carrier positioning means attached to said leadframe and extending into the circumscribed area such that said positioning means engages the carrier by applying forces against the carrier, thereby supporting the carrier and maintaining each of the contact pads of the carrier in contact and alignment with a respective lead of the leadframe.

According to another aspect of the invention, there is provided a method for attaching leads to contact pads on a carrier for an integrated circuit device wherein said leads are part of a leadframe and said leadframe has resilient means for engaging said carrier for supporting the carrier and aligning the contact pads of the carrier with the leads including the steps of mounting the carrier within the leadframe such that said resilient means engages the carrier by exerting forces on the carrier so as to support the carrier and align each with a respective lead contact pad joining each lead to a contact pad, and removing the leadframe and the resilient means to result in a carrier with leads attached to the contact pads thereof.

According to a further aspect of the invention, there is provided a leadframe having a frame and a plurality of conductive leads attached to the frame and having lead end portions overlying contact pads on a carrier for an integrated circuit device, such that each end portion of a lead is to be connected to a respective contact pad, and pairs of resilient positioning fingers attached to the frame for engaging respective edges of the carrier so as to support and position the carrier such that each contact pad on the carrier is in contact with a respective end portion of a lead.

BRIEF DESCRIPTION OF THE DRAWINGS

The foregoing and other objects, aspects and advantages of the invention will be better understood from the following detailed description of the preferred embodiment of the invention, with reference to the accompanying drawings in which.

DETAILED DESCRIPTION OF THE PREFERRED EMBODIMENT

Figure 1:
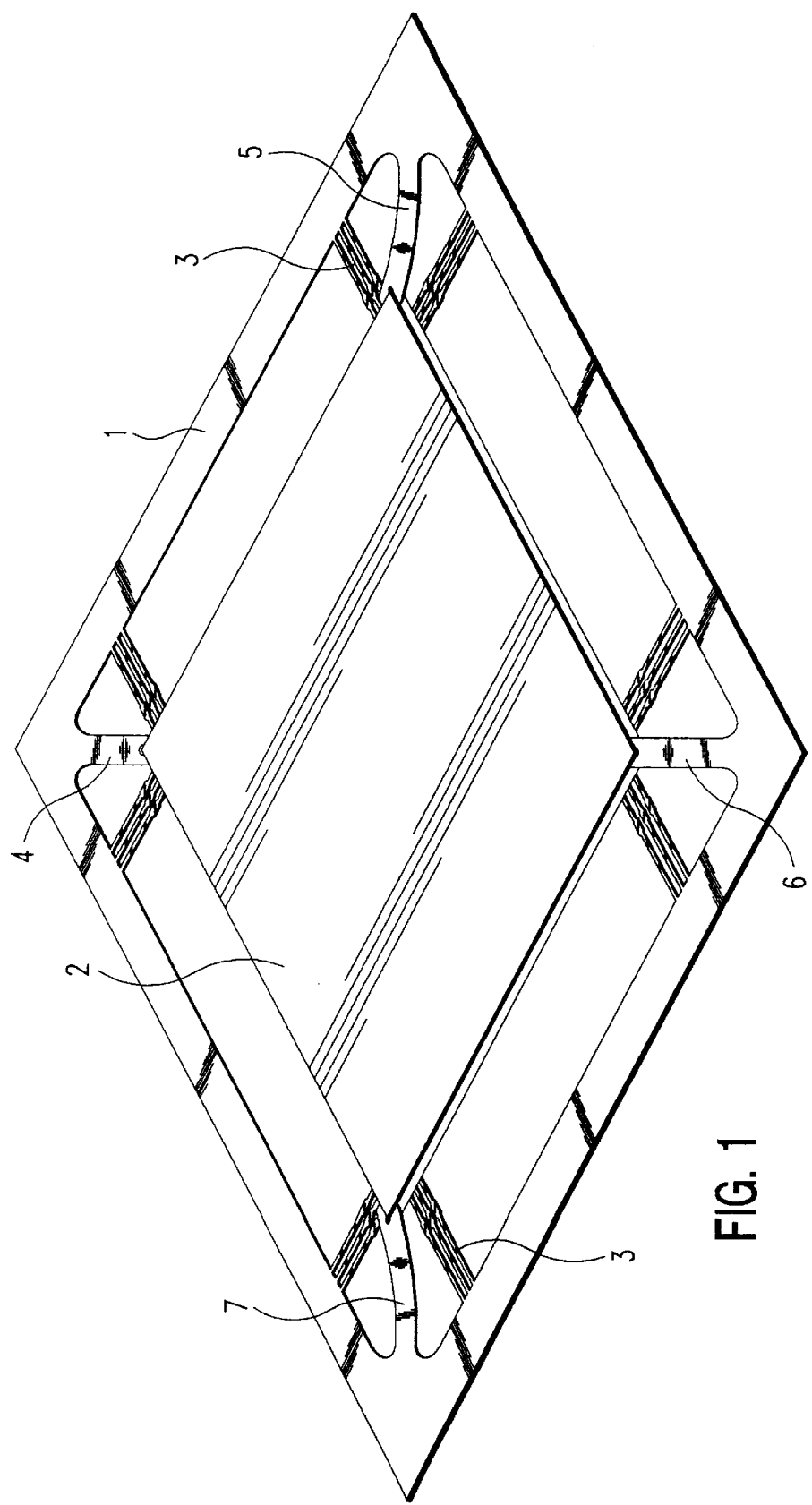
FIG. 1 is a top view showing a leadframe and a carrier, according to the invention, FIG. 2 provides in more detail aspects of FIG. 1 showing the locator or positioning fingers.

The preferred embodiment of the invention includes the addition of a number and in the preferred embodiment, four, thermal expansion compensator locating legs or fingers each positioned at a corner of the leadframe. These locating legs are resilient and flexible and hold, support and retain the carrier by a spring effect. Thus, it is necessary that the additional legs or fingers be somewhat longer than the distance from the leadframe to the ceramic substrate or carrier so that when the carrier is properly positioned within the leadframe, the locating legs of the leadframe are flexed and thus the carrier is supported by these additional fingers or legs and the spring effect resulting therefrom. Preferably the fingers would be positioned uniformly around the frame, possibly one at each corner, so that the substrate is actually supported by the resilient fingers. It is preferable that the fingers engage the substrate towards the top of each side or corner of the substrate. The ends of the fingers could also be notched to accommodate and engage the corner of the substrate. Thus, when the substrate is properly positioned and supported by the legs, the legs are flexed by the spring effect resulting from the resiliency of the legs. This results in the contacts of the carrier being properly positioned with respect to the leads of the leadframe. The leadframe with the fingers as part thereof could be conveniently stamped in an interference fit fashion with respect to the substrate.

During the brazing activity to attach the leads to the contact pads and the resultant high temperature, the spring effect of the legs may decrease slightly because of the difference in thermal coefficient of expansion between the material of the leadframe and the carrier but since the differences in expansion will be uniform, the accurate positioning of the contacts of the carrier and the leads is still assured. It has been found that the thermal expansion of the leadframe during heating is uniform and because of the difference of materials of the leadframe and the carrier, the leadframe total expansion is approximately 0.008" whereas that of the carrier is between 0.003" and 0.004" for a 50 mm carrier substrate. Although the pitch of the leads, which is the distance between the leads, may change slightly during the brazing process and the temperature resulting therefrom, this has been found not to be enough to move the lead off the respective contact pad on the carrier or to result, for example, in a lead contacting or bridging two adjacent pads.

Thus, by use of the present invention since there is no need for use of fixtures and because there is no need for designing built-in play between each fixture and the leadframe or carrier, there is not significant movement of the leads away from the contact pads and thus proper bonding occurs. Any additional step of visually aligning the leads and the contacts before brazing is also not required. Thus, with this disclosed leadframe of the preferred embodiment and its use in attaching leads to a carrier, it has been found that the alignment problems resulting from the different coefficients of thermal expansion and the amount of play that had previously been required between the various elements and the fixtures, have been overcome.

The invention also overcomes the need for providing retaining tabs on the leadframe and the need for folding or bending such tabs as described in some prior art references. Thus the present invention overcomes an additional fabrication step and the size or area of the leadframes does not have to be increased to provide for the alignment and positioning fingers.

Reference is now made to the accompanying drawings, which illustrate a preferred embodiment of the invention, in order to provide more detailed aspects of the invention.

With reference to FIG. 1, leadframe 1 is a leadframe according to aspects of the invention. As is typical in the integrated circuit industry, the leadframe circumscribes an area in which is positioned a substrate or carrier 2. Leadframe 1 includes a plurality of leads 3. Each lead at the one end is formed as part of and attached to the leadframe 1 and at the other end, extends to and overlays contact pads on the carrier 2 as will be subsequently described in more detail. As is common in the integrated circuit packaging industry, leads 3 extend inwardly from frame 1 uniformly all around the frame, although only a limited number of leads are shown in FIG. 1. The invention is not limited to a leadframe having any particular number of leads.

Not shown in FIG. 1 but as is well known to those in the industry, contact pads on carrier 2 to which the end portions of leads 3 of the leadframe 1 are to be connected, and which are actually on the reverse side of carrier 2 as shown in FIG. 1 as will be subsequently described, are electrically connected by conductive traces to a contact pad array on the opposite side of the carrier which would be the visible or top side of carrier 2 shown in FIG. 1. The integrated circuit device or chip, has a contact array matching the contact pad array on the upper side of the carrier and this is how the chip is connected or mounted to the carrier. As is known in the art, the chip and leadframe may alternatively be connected and mounted to the same side of the carrier. This detail is not shown in FIG. 1 as it is well known in the art and forms no aspect of the subject invention.

Also shown in FIG. 1 are resilient carrier positioning means. These could be implemented by the fingers or locating legs 4, 5, 6 and 7. In FIG. 1, in this preferred embodiment, such fingers are shown at each of the four corners of the carrier 2 and leadframe 1.

Typically, leadframe 1 with leads 3 and fingers 4, 5, 6 and 7, could be made by stamping processes from a sheet of the same material, etching processes or any other appropriate manufacturing processes. Leadframes are typically supplied by a variety of companies and the process of making the leadframes is well known. The material of the leadframe could be any suitable material and has to be such that a spring or tension property results in the locating fingers as will be subsequently described. Material Alloy 42 supplied by Carpenter Technology Corp. has been found to be appropriate. A plurality of such leadframes could be made in strips so as to facilitate the automation of the attaching of the leads to the carrier.

Leads 3 of leadframe 1 of course must be long enough to extend past the edge of the carrier and all around the carrier as appropriate and for each lead to overlay the contact pad on the carrier when the carrier is properly positioned within leadframe 1. The number of leads for the invention is really irrelevant but certainly the invention achieves a greater degree of usefulness as the number of leads increases.

Fingers 4, 5, 6 and 7 are somewhat shorter or extend a lesser distance into the area circumscribed by the leadframe when compared with the length of leads 3. As is shown, fingers 4, 5, 6 and 7 only abut or engage the edge or corner of carrier 2. However, fingers 4, 5, 6 and 7 must be long enough to be able to apply positioning or retentive force on carrier 2. This results and is accomplished from opposing pairs of fingers as shown in FIG. 1. By opposing pairs of fingers is meant fingers 4 and 6 and fingers 5 and 7 as shown. Thus, before carrier 2 is mounted in leadframe 1, the distance between the ends of the opposing fingers, for example fingers 5 and 7, or fingers 4 and 6 in FIG. 1, would be slightly less than the measurement of the carrier between diagonal corners. When carrier 2 is positioned within leadframe 1 and in particular between fingers 4 and 6 and 5 and 7, carrier 2 is then held in position by the forces resulting from the spring effect caused by the flexing of the opposing fingers. The pressure on the carrier resulting from the pairs of opposing fingers also maintains the carrier and the leadframe properly positioned so that the contact pads on carrier 2 are positioned over leads 3 or the end portions of leads 3. As can be seen, the fingers 4, 5, 6 and 7 and their resulting actions with the carrier substrate, not only abut or engage the carrier but can also be thought of as acting as a clip-on lead frame, or providing a clip-on lead frame function to hold and support the carrier.

When the combination of the leadframe and carrier, as has been described, is positioned in a furnace to reflow the metal on the contact pads in order to form a permanent connection between the pads and the leads, the pair of opposing fingers 4, 6 and 5, 7 compensate for any difference in thermal expansion between the carrier and the leadframe and prevents the leads 3 or end portions of leads 3 from moving off of the contacts on carrier 2. The forces resulting from any change in expansion of the leadframe as a result of the pairs of fingers, are equal and opposite. The forces thereby effectively cancel each other out and leads 3 remain properly positioned on the contacts of carrier 2. In a similar way, any lateral movement resulting from temperature mismatch of the leadframe and the carrier is compensated for and the end portions of the leads remain properly positioned on the respective contact pads on carrier 2.

After the combination as described above has been placed in a furnace resulting in the reflow of the metal of the contact pads so that the leads are properly positioned and connected to the contacts, once the connection is cooled and hardened, the leadframe is removed from the carrier by trimming the leads 3 at an appropriate length from the carrier. Frame 1 and the fingers 4, 5, 6 and 7 are then discarded and carrier 2 with the leads 3 appropriately attached thereto then remain for further packaging, processing or mounting on a circuit board, as the case may be.

Figure 2:
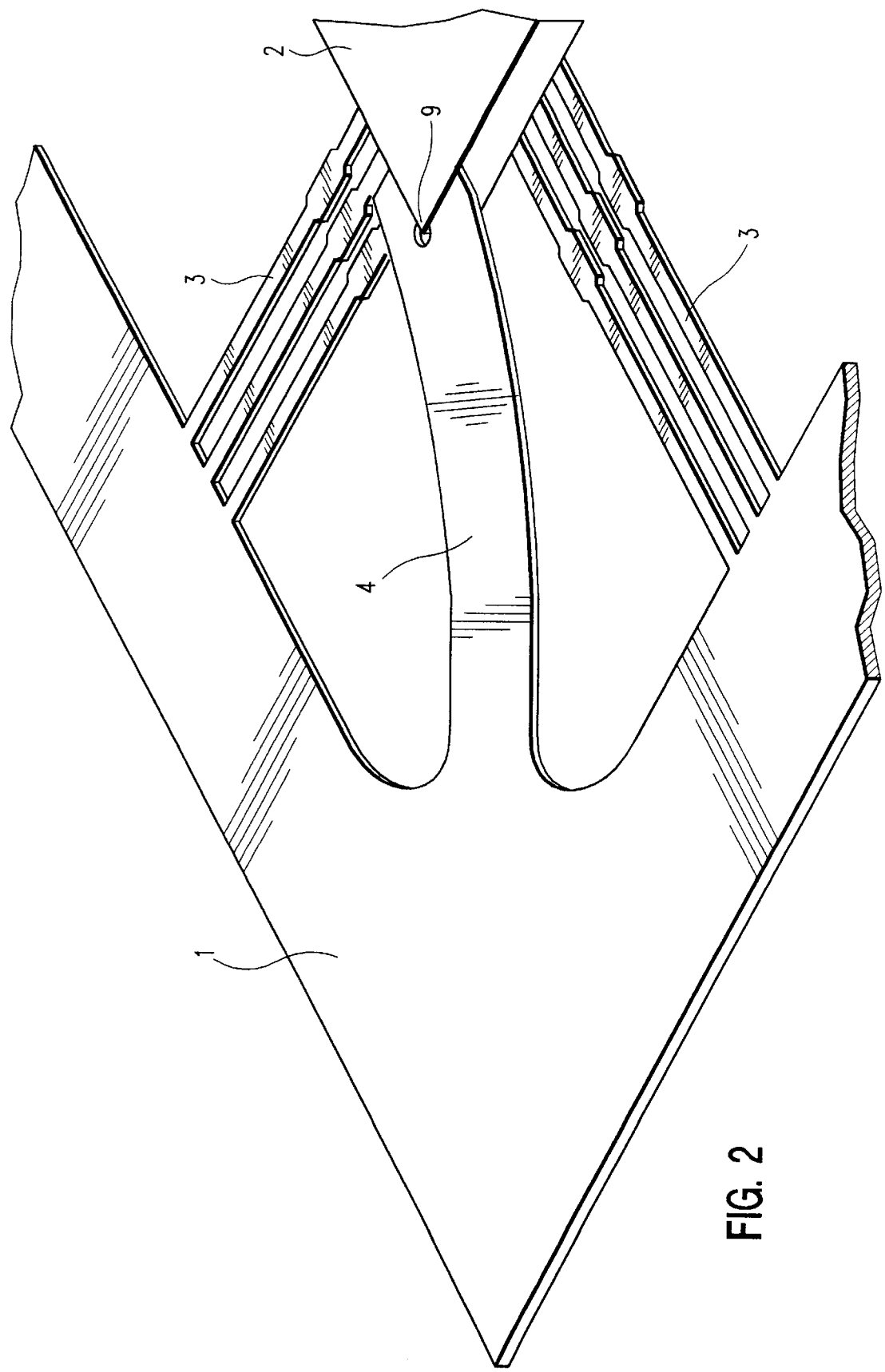

Referring now to FIG. 2 of the drawings, more details of one of the corner arrangements shown in FIG. 1 is illustrated. It can be seen that the thickness of the material of leadframe 1 and finger 4 is less than that of carrier 2. A slight buckling or flexing of finger 4 is apparent and this has resulted, as has been previously described, because of the equal and opposite retentive forces exerted by the pair of fingers, for example fingers 4 and 5, on the carrier. Finger 4 can engage or abut carrier 2 at any height within the thickness of the carrier. However it has been found for best matching to have the finger close to the top edge of carrier 2, as is shown. Finger 4 may also be appropriately shaped or notched, as shown by notch 9 in the end of finger 4, in order to accommodate the shape of the corner of carrier 2, thereby more firmly engaging the carrier and minimizing accidental movement or slippage of the end of the finger with respect to the carrier. FIG. 2 is representative of any one of the corner arrangements. As has been previously described, the leads 3 shown are only representative of the number of leads which can be accommodated.

Figure 3:
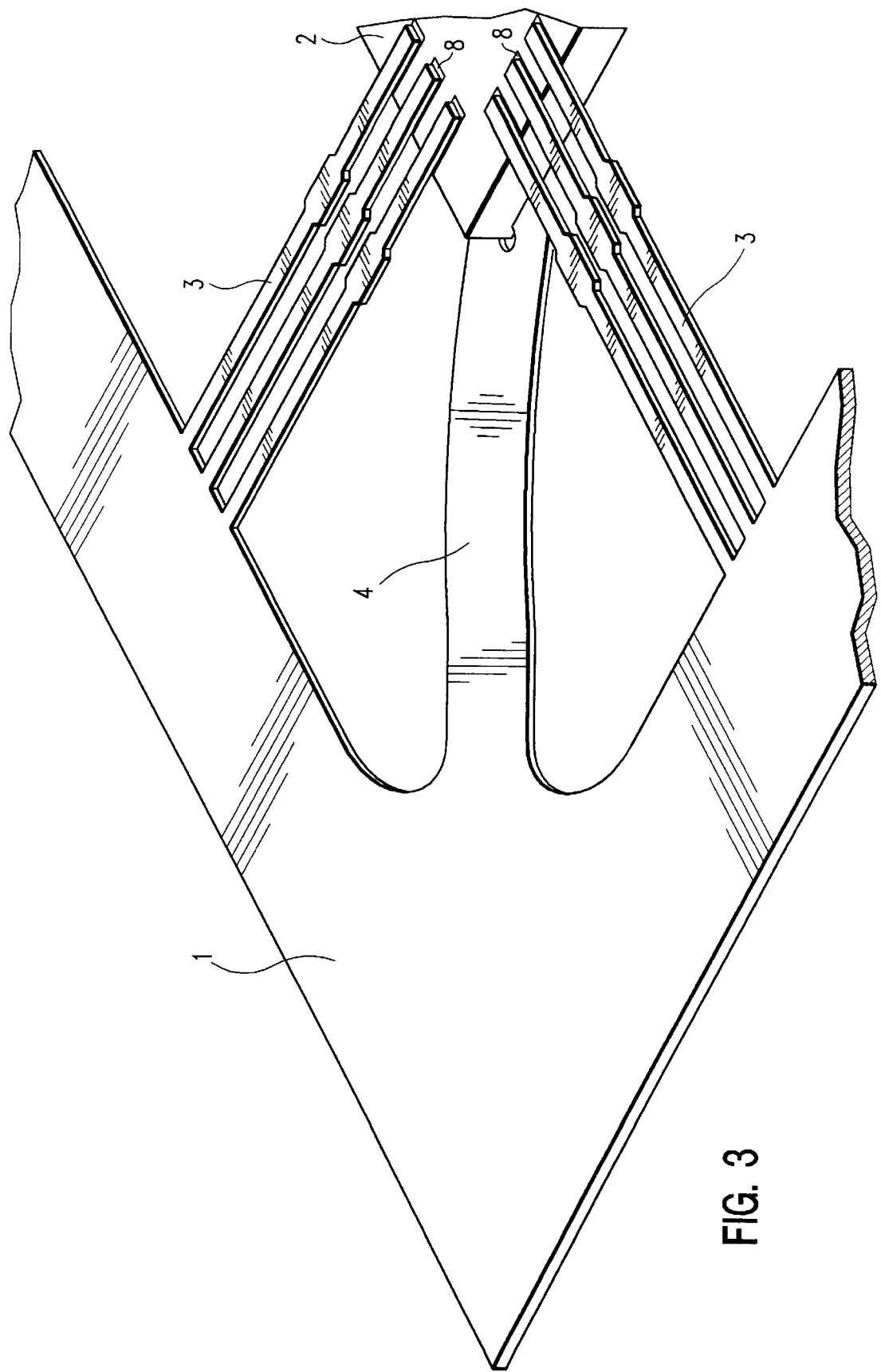
FIG. 3 is a more detailed view from the underside of the carrier showing aspects of FIG. 2.

Referring now to FIG. 3 of the drawings which shows in more detail one of the representative corners of the structure illustrated in FIG. 1 and is the underside of carrier 2 or the reverse side of what is shown in FIG. 2. Finger 4 is shown abutting against the corner of carrier 2 and effectively supporting the carrier in combination with the other fingers as previously described. Also, as a result of the action of the fingers and in particular Finger 4 as shown, the ends of leads 3 are properly positioned over contact pads 8 on carrier 2. Thus, when carrier 2 is mounted within the resilient carrier positioning means comprising the various fingers 4, 5, 6 and 7 in the preferred embodiment of the invention, it can be seen that carrier 2 is now properly positioned for attaching the ends of leads 3 onto the contact pads 8. As is also shown in FIGS. 1 and 2, FIG. 3 shows finger 4 as being slightly flexed or bowed. Once this combination is placed into a furnace for reflow of the material of pads 8, any mismatch in temperature coefficient between the leadframe 1 and carrier 2 is compensated for by the fingers 4, 5, 6 and 7 and the ends of leads 3 remain effectively properly positioned on contacts 8 as previously described.

It is apparent that it is not necessary for the resilient carrier positioning means to be positioned at the corners of carrier 2. It may very well be that the positioning means could be located along the edges of the carrier. However, it is preferable that the positioning means be employed as pairs so that each positioning means exerts uniform and opposite force in order to cancel out and prevent any movement of the carrier with respect to the leadframe and between the ends of leads 3 and contact pads 8.

It should be understood that the foregoing description is only illustrative of a preferred embodiment of the invention. Various alternatives and modifications can be devised by those skilled in the art without departing from the intended invention. Thus, the present invention is intended to embrace all such alternatives, modifications and variations which fall within the scope of the appended claims.

We claim:

1. A leadframe for supporting a carrier for an integrated circuit device and maintaining alignment of contact pads on the carrier with leads of the leadframe, comprising:

a leadframe circumscribing a predetermined area commensurate in shape and size as the carrier and having a plurality of leads on each side of said frame and extending into the circumscribed area; and resilient carrier positioning means attached to said leadframe and extending into the circumscribed area such that said resilient carrier positioning means engages the carrier by applying forces against the carrier to support the carrier and maintain each of the contact pads of the carrier in contact and alignment with a respective lead of the leadframe.

2. The leadframe as recited in claim 1, wherein said plurality of leads and said resilient carrier positioning means are attached to inner edges of the leadframe.

3. The leadframe as recited in claim 2 wherein said resilient carrier positioning means consists of fingers attached to inner edges of the leadframe and the forces applied on the carrier result from a spring effect of the fingers pushing on the carrier.

4. The leadframe as recited in claim 3 wherein said leadframe circumscribes a square area and said fingers are attached to each inner corner of the leadframe.

5. The leadframe as recited in claim 3 wherein said fingers engage the carrier at the corners thereof and the end of each finger is shaped to accommodate the respective shape of the corner of the carrier.

6. A leadframe comprising a frame and a plurality of conductive leads attached to the frame and having lead end portions overlying contact pads on a carrier for an integrated circuit device, such that each end portion of a lead is to be connected to a respective contact pad, and pairs of resilient positioning fingers attached to the frame for engaging respective edges of the carrier so as to support and position the carrier such that each contact pad on the carrier is in contact with a respective end portion of a lead.

7. The leadframe as recited in claim 6 such that each finger of a pair of fingers engages the carrier on opposite edges by resiliently pushing on the carrier in an opposing manner to each other.

8. A leadframe arrangement comprising:

a carrier for an integrated circuit and having a plurality of contact pads;

a leadframe circumscribing an area commensurate in shape and size as said carrier and having a plurality of leads on each side of said frame and extending into the circumscribed area, said leadframe further having resilient carrier positioning means attached to said leadframe and extending into the circumscribed area such that said resilient carrier positioning means engages said carrier by applying forces against said carrier to support said carrier and maintain each of the contact pads of said carrier in contact and alignment with a respective lead of said leadframe.

9. The leadframe arrangement as recited in claim 8, wherein said plurality of leads and said resilient carrier positioning means are attached to inner edges of the leadframe.

10. The leadframe arrangement as recited in claim 9 wherein said resilient carrier positioning means consists of fingers attached to inner edges of the leadframe and the forces applied on said carrier result from a spring effect of the fingers pushing on said carrier.

11. The leadframe arrangement as recited in claim 10 wherein said leadframe circumscribes a square area and said fingers are attached to each inner corner of the leadframe.

12. The leadframe arrangement as recited in claim 10 wherein said fingers engage said carrier at the corners thereof and the end of each finger is shaped to accommodate the respective shape of the corner of said carrier.

13. The leadframe as recited in claim 1 wherein there are at least two, opposed resilient carrier positioning means having a distance between them that increases when the carrier is placed in the leadframe such that the opposed resilient carrier positioning means flex to resiliently support the carrier.

14. The leadframe as recited in claim 6 wherein there is at least one pair of opposed resilient positioning fingers having a distance between them that increases when the carrier is placed in the leadframe such that the opposed resilient positioning fingers flex to resiliently support the carrier.

15. The leadframe arrangement as recited in claim 8 wherein there are at least two, opposed resilient carrier positioning means having a distance between them that increases when the carrier is placed in the leadframe such that the opposed resilient carrier positioning means flex to resiliently support the carrier.

* * * * *